(12) United States Patent
Xiong et al.

(10) Patent No.: US 10,727,821 B2
(45) Date of Patent: Jul. 28, 2020

(54) TRANSMISSION HYSTERESIS DETECTING METHOD AND APPARATUS

(71) Applicant: UBTECH ROBOTICS CORP LTD, Shenzhen (CN)

(72) Inventors: Youjun Xiong, Shenzhen (CN); Lifu Zhang, Shenzhen (CN); Wenhua Fan, Shenzhen (CN); Hanyu Sun, Shenzhen (CN)

(73) Assignee: UBTECH ROBOTICS CORP LTD, Shenzhen (CN)

( * ) Notice: Subject to any disclaimer, the term of this patent is extended or adjusted under 35 U.S.C. 154(b) by 0 days.

(21) Appl. No.: 16/509,515

(22) Filed: Jul. 12, 2019

(65) Prior Publication Data

US 2020/0212897 A1    Jul. 2, 2020

(30) Foreign Application Priority Data

Dec. 26, 2018 (CN) .......................... 2018 1 1602320

(51) Int. Cl.
*H03K 3/00* (2006.01)
*H03K 3/3565* (2006.01)
*H03K 5/24* (2006.01)

(52) U.S. Cl.
CPC ......... *H03K 3/3565* (2013.01); *H03K 5/2472* (2013.01)

(58) Field of Classification Search
CPC ........................... H03K 3/3565; H03K 5/2472
USPC ........................................................ 327/205
See application file for complete search history.

(56) References Cited

U.S. PATENT DOCUMENTS 9,903,381 B2 * 2/2018 Liu ....................... F04D 19/005
2015/0355607 A1 * 12/2015 Nagaoka ................. H02P 29/00
318/561

\* cited by examiner

*Primary Examiner* — Metasebia T Retebo (57) ABSTRACT

The present disclosure provides a transmission hysteresis detecting method and apparatus. The method includes: transmitting a forward rotational instruction and a reverse rotational instruction to a motor of the servo; storing motor end positions of the motor and output shaft end positions of an output shaft corresponding to the motor in a forward rotational cycle and a reverse rotational cycle, respectively; generating first position data based on the motor end positions and the corresponding output shaft end positions in the forward rotational cycle; generating second position data based on the motor end positions and the corresponding output shaft end positions in the reverse rotational cycle; and calculating a transmission hysteresis of the servo based on the first position data and the second position data. The technical solutions of the present disclosure only needs to obtain the position data of one forward rotational cycle and one reverse rotational cycle.

7 Claims, 6 Drawing Sheets

TRANSMISSION HYSTERESIS DETECTING METHOD AND APPARATUS

TRAVERSE REFERENCE TO RELATED APPLICATION PROGRAMS

This application claims priority to Chinese Patent Application No. CN 201811602320.9, filed Dec. 26, 2018, which is hereby incorporated by reference herein as if set forth in its entirety.

BACKGROUND

1. Technical Field

The present disclosure relates to servo technology, and particularly to a transmission hysteresis detecting method and apparatus.

2. Description of Related Art

Hysteresis refers to the hysteresis amount of an output shaft of a motor at a rotational angle when an input shaft of the motor starts to rotate reversely to drive the output shaft to rotate reversely during an single-direction transmission of a transmission device. The hysteresis is composed of pure backlash and elastic hysteresis. The pure backlash is constant while the elastic hysteresis is changed with transmission torque. The so-called hysteresis generally refers to a hysteresis at a rated torque. It should be noted that, the hysteresis is not merely meaningful in the reverse direction, but also take effects in the single-direction transmission. When the rotational speed of the input shaft is changed, the output shaft will also have a hysteresis response due to the effects of inertia torque and torsional stiffness. The output shaft will have a hysteresis when the input shaft accelerates, and the output shaft will have a lead when the input shaft decelerates, which are also reflections of the hysteresis. The factors affecting the hysteresis include gear pair backlash, center distance error, bearing gap, geometric eccentricity of the gear and the shaft, torsional stiffness of the shaft pump, temperature variation, and the like. However, the main influencing factor is the gear pair backlash and the torsional stiffness of the shaft pump. For a certain transmission, the hysteresis can only be obtained through detection. There are many traditional methods to detect the hysteresis, for example, the successive loading method, while they generally have the disadvantages of complicated operation and low efficiency.

BRIEF DESCRIPTION OF THE DRAWINGS

To describe the technical schemes in the embodiments of the present disclosure more clearly, the following briefly introduces the drawings required for describing the embodiments or the prior art. Apparently, the drawings in the following description merely show some examples of the present disclosure. For those skilled in the art, other drawings can be obtained according to the drawings without creative efforts.

DETAILED DESCRIPTION

In the following descriptions, for purposes of explanation instead of limitation, specific details such as particular system architecture and technique are set forth in order to provide a thorough understanding of embodiments of the present disclosure. However, it will be apparent to those skilled in the art that the present disclosure may be implemented in other embodiments that are less specific of these details. In other instances, detailed descriptions of well-known systems, devices, circuits, and methods are omitted so as not to obscure the description of the present disclosure with unnecessary detail.

It should be understood that, when used in this specification and the claims, the term "comprise" or "include" indicates the existence of the described feature, entirety, step, operation, element, and/or component, while the existence or addition of other feature, entirety, step, operation, element, component, and/or their combination is not excluded.

It is also to be understood that, the terminology used in the description of the present disclosure is only for the purpose of describing particular embodiments and is not intended to limit the present disclosure. As used in the description and the appended claims of the present disclosure, the singular forms "a," "an," and "the" are intended to include the plural forms as well, unless the context clearly indicates otherwise.

It is also to be further understood that the term "and/or" used in the description and the appended claims of the present disclosure refers to any combination of one or more of the associated listed items and all possible combinations, and includes such combinations.

As used in the description and the appended claims, the term "if" may be interpreted as "when" or "once" or "in response to determining" or "in response to detecting" according to the context. Similarly, the phrase "if determined" or "if [the described condition or event] is detected" may be interpreted as "once determining" or "in response to determining" or "on detection of [the described condition or event]" or "in response to detecting [the described condition or event]".

In specific implementations, in the present disclosure, a terminal device in the embodiments includes but is not limited to portable devices such as a mobile phone, a laptop computer or a tablet computer which has a touch sensitive surface (e.g., a touch screen display and/or a touch pad). It should also be understood that, in some embodiments, the above-mentioned device can be not a portable communication device, but a desktop computer having a touch sensitive surface (e.g., a touch screen display and/or a touch pad).

In the following discussion, terminal devices including a display and a touch sensitive surface are described. However, it should be understood that, a terminal device may include one or more other physical user interface devices such as a physical keyboard, mouse, and/or joystick.

The terminal device supports various applications such as one or more of: a drawing application, a presentation application, a word processing application, a website creation application, a disk burning application, a spreadsheet application, a game application, a phone applications, a video conferencing application, an email application, an instant messaging application, an exercise support application, a photo management application, a digital camera application, a digital video camera application, a web browsing application, a digital music player application, and/or a digital video player application.

Various applications that can be executed on the terminal device can use at least one common physical user interface device such as a touch sensitive surface. One or more functions of the touch sensitive surface and corresponding information displayed on the terminal device can be adjusted and/or changed between applications and/or within a corresponding application. In this way, the common physical architecture (e.g., a touch-sensitive surface) of the terminal device can support various applications with a user interface that is intuitive and transparent to the user.

In addition, in the present disclosure, the terms "first", "second", and the like in the descriptions are only used for distinguishing, and cannot be understood as indicating or implying relative importance.

For the purpose of describing the technical solutions of the present disclosure, the following describes through specific embodiments.

Figure 1:
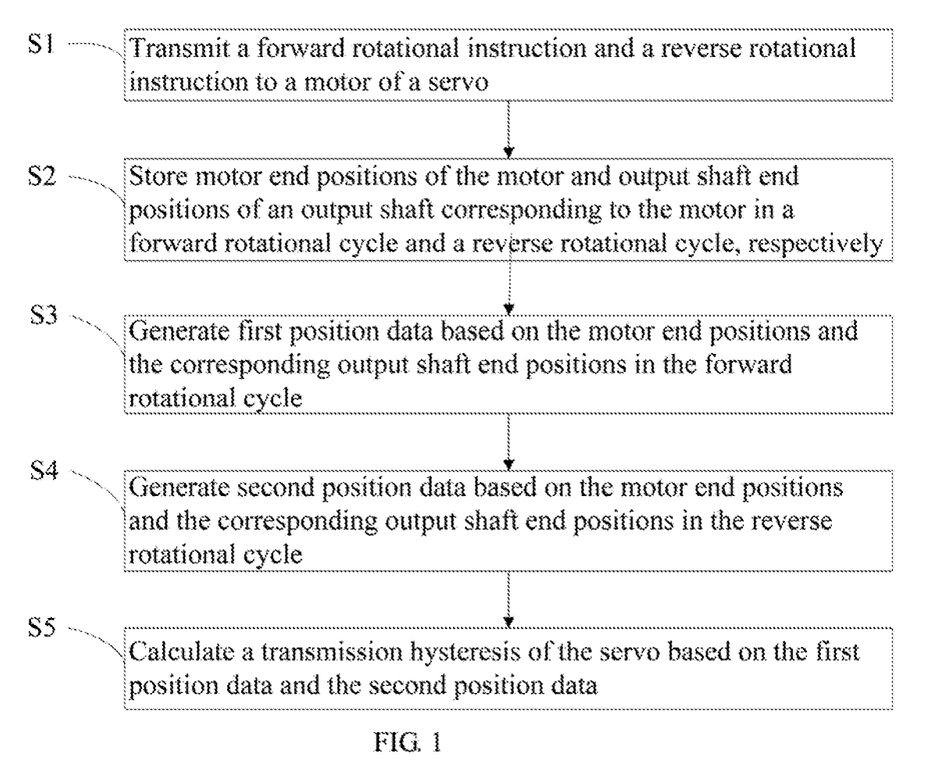
FIG. 1 is a flow chart of a transmission hysteresis detecting method according to a first embodiment of the present disclosure.

FIG. 1 is a flow chart of a transmission hysteresis detecting method according to a first embodiment of the present disclosure. In this embodiment, a transmission hysteresis detecting method for a servo is provided. The method is a computer-implemented method executable for a processor, which may be implemented through and applied to a transmission hysteresis detecting apparatus shown in FIG. 5 that is for a servo or a transmission hysteresis detecting apparatus/terminal device shown in FIG. 6 that is for a servo, or implemented through a storage medium. In which, the servo is driven by a motor, and may be used as a joint of a robot so as to realize the movement of a limb of the robot which connected to the joint. As shown in FIG. 1, the method includes the following steps.

S1: transmitting a forward rotational instruction and a reverse rotational instruction to the motor of the servo.

S2: storing motor end positions of the motor and output shaft end positions of an output shaft corresponding to the motor in a forward rotational cycle and a reverse rotational cycle, respectively.

S3: generating first position data based on the motor end positions and the corresponding output shaft end positions in the forward rotational cycle.

S4: generating second position data based on the motor end positions and the corresponding output shaft end positions in the reverse rotational cycle.

In this embodiment, the motor of the servo and the output shaft coupled to the motor are both provided with a position sensor. When the motor of the servo is operated, the output shaft rotates with the motor. The position sensor of the motor obtains the position change when the motor is operated so as to obtain the motor end positions, and the position sensor of the output shaft obtains the position change when the output shaft rotates so as to obtain the output shaft end positions. In which, the position sensor is a potentiometer, a magnetic encoder, or a photoelectric encoder.

In this embodiment, the transmission hysteresis detecting method is executed through a transmission hysteresis detecting apparatus/terminal device such as an upper computer of the servo, the servo itself, or other devices, or a terminal device such as a computer, a mobile phone, a tablet computer, or the like. After the transmission hysteresis detecting apparatus/terminal device transmits the forward rotational instruction to the motor, the motor executes the forward rotational instruction after receiving, and the output shaft rotates with the motor. At this time, the transmission hysteresis detecting apparatus/terminal device continuously obtains the motor end positions from the position sensor of the motor and the output shaft positions from the position sensor of the output shaft within one forward rotational cycle of the motor so as to generate the first position data. Similarly, after the transmission hysteresis detecting apparatus/terminal device transmits the reverse rotational instruction to the motor, the motor executes the forward rotational instruction after receiving and the output shaft rotates with the motor. At this time, the transmission hysteresis detecting apparatus/terminal device continuously obtains the motor end positions from the position sensor of the motor and the output shaft end positions from the position sensor of the output shaft within one reverse rotational cycle of the motor. In which, the first position data and the second position data each includes a plurality of motor end position data of and a plurality of output shaft end position data. The frequencies of the transmission hysteresis detecting apparatus/terminal device to obtain the motor end positions and the output shaft end positions from the position sensors are better to be as fast as possible, which can be set to 1 ms, 2 ms, and the like according to the actual communication capability of system.

It should be noted that, the motor end positions and the output shaft end positions included in the first position data belong to the same forward rotational cycle. Similarly, the motor end positions and the output shaft end positions included in the second position data belong to the same reverse rotational cycle.

It can be understood that, the transmission hysteresis detecting apparatus/terminal device applies a first pulse width modulation signal to the motor to control the motor to rotate forwardly, and applies a second pulse width modulation signal to the motor to control the motor to rotate reversely. Furthermore, in order to improve the detection accuracy of the position sensor so that the motor can be operated at a lower speed, the duty ratios of the first pulse width modulation signal and the second pulse width modulation signal are the same and are both within 10%-50%, for example, 25%.

In one embodiment, in order to facilitate the recording, after the transmission hysteresis detecting apparatus/terminal device transmits the forward rotational instruction to the motor of the servo, the condition of the feedback of the motor end positions of the motor is continuously detected. When it is detected that the motor end positions of the motor is at a minimum position, it continuously obtains and stores the motor end positions and the output shaft end positions corresponding to the motor until it is detected that the motor end positions of the motor is at the maximum position, and then the first position data is generated. After the transmission hysteresis detecting apparatus/terminal device transmits the reverse rotational instruction to the motor of the servo, it continuously obtains and stores the motor end positions and output shaft end positions until it is detected that the motor end positions of the motor is at a minimum position, and then the second position data is generated. In this embodiment, the change of the motor end positions from the minimum position to the maximum position represents one forward rotational cycle, and the change of the motor position positions from the maximum position to the minimum position represents one reverse rotational cycle. It should be noted that, in the technical scope of the present disclosure, different definitions to the positions of the motor for the forward and reverse rotational cycles can be easily conceived, for example, the change of the motor end positions from the maximum position to the minimum position can represent one forward rotational cycle, and the change of the motor position positions from the minimum position to the maximum position can represent one reverse rotational cycle, which is not described herein.

Using a photoelectric encoder as the position sensor is taken as an example. When the photoelectric encoder detects the positions of the motor or the output shaft, the motor end positions or the output shaft end positions will be reflected on an encoder disc. The encode disc is a disc made according to a certain encoding manner, and the encode disc is composed of a plurality of circular code lanes which are sequentially nested, where the outermost one is a lowest position, that is, the minimum position, and the innermost one is a highest position, that is, the maximum position.

S5: calculating a transmission hysteresis of the servo based on the first position data and the second position data.

After obtaining the first position data and the second position data, the transmission hysteresis detecting apparatus/terminal device transmits a stop instruction to the motor to stop the motor from moving, and the position data of the motor end and the output shaft end of the forward and reverse rotational cycles stored by step S1 are analyzed to obtain a detection result.

Through this embodiment, it only needs to obtain the position data of one forward rotational cycle and the position data of one reverse rotational cycle, which does not need multiple loadings and has the characteristics of simple operation and few manual interventions, and is capable of realizing automated testing.

Figure 2:
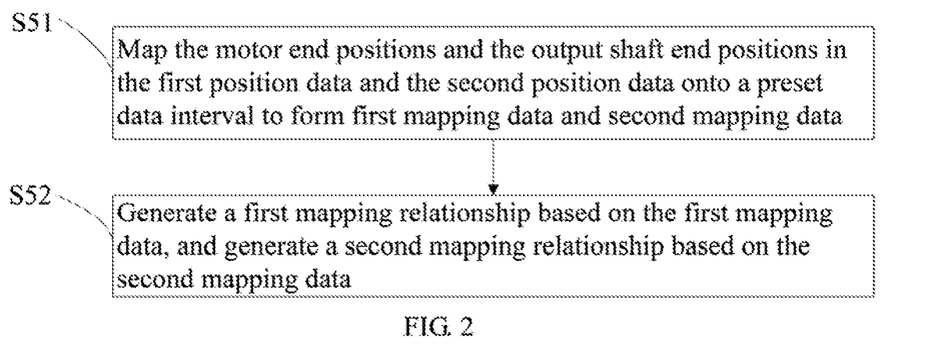
FIG. 2 is a detailed flow chart of step S2 of the transmission hysteresis detecting method of the embodiment of FIG. 1.

FIG. 2 is a detailed flow chart of step S2 of the transmission hysteresis detecting method of the embodiment of FIG. 1. As shown in FIG. 2, step S5 includes the following sub-steps.

S51: mapping the motor end positions and the output shaft end positions in the first position data and the second position data onto a preset data interval to form first mapping data and second mapping data.

In this embodiment, since the resolutions of the position sensor of the motor and the position sensor of the output shaft end may be different, the amount of data collected by the position sensors may be different due to the difference in the resolutions of the position sensors. For example, the data amount of the analog value collected by a 12-bit binary position sensor is $2^{12}=4096$, and the data amount of the analog value collected by a 16-bit binary sensor is $2^{16}=65536$. In the same forward rotational cycle or reverse rotational cycle, when the resolutions of the position sensor of the motor and the position sensor of the output shaft are different, the data amount of the motor end positions and the data amount of the corresponding output shaft end positions in the obtained first position data and the second position data are different. In order to map the data amounts of the motor end positions and the output shaft end positions in a one by one manner, it needs to unify the data amounts of the motor end positions and the data amount of the corresponding output shaft end positions in the first position data and second position data, that is, the motor end positions and output shaft end positions are both mapped to the same data interval. For example, the range of the position data of the motor is 0-65535 (for a 16-bit sensor), and the range of the position data of the output shaft is 0-4095 (for a 12-bit sensor), then the data of the motor can be mapped to a data range of 0-4095, and the position data of the motor and the position data of the output shaft can be mapped to a data range of 0-256. In one embodiment, a large range of data is mapped to a small range of data, and only the mapping in one direction is required, that is, the motor end positions can be mapped to a data interval corresponding to the output shaft end positions, or the output shaft end positions can be mapped to a data interval corresponding to the output shaft end positions. It should be noted that, when the position sensor of the motor and the position sensor of the output shaft are the same, the mapped data interval is the same as the original data interval, and the mapping may not be performed at this time.

S52: generating a first mapping relationship based on the first mapping data, and generating a second mapping relationship based on the second mapping data.

The corresponding data interval of mapping the motor end positions to the output shaft end positions is taken as an example. After mapping the motor end positions to the data interval 0-4095 corresponding to the output shaft end positions, the data amount of the motor end positions is the same as the data amount of output shaft end positions, and the data of the motor end positions and the data of the output shaft end positions correspond to each other in an one by one manner. In this case, a mapping relationship is generated based on a correspondence between the data of the motor end positions and the data of the output shaft end positions. The correspondence between the data of the mapped motor end positions and the data of output shaft end positions in the first position data generates the first mapping relationship, and the correspondence between the data of the mapped motor end positions and the data of output shaft end positions in the second position data generates the second mapping relationship. Finally, step S52 is executed, that is, the transmission hysteresis of the servo is calculated based on the first mapping relationship and the second mapping relationship.

Figure 3:
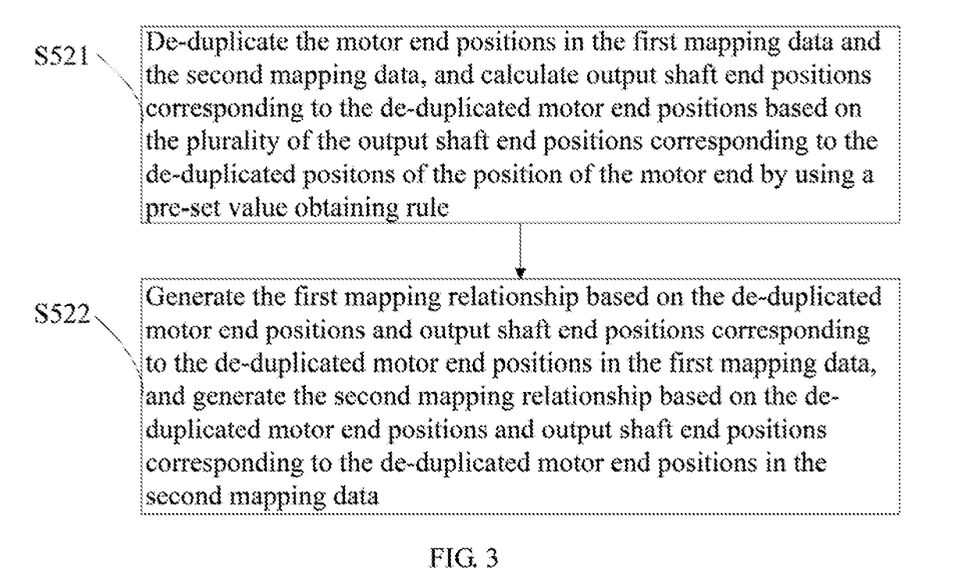
FIG. 3 is a detailed flow chart of step S52 of the transmission hysteresis detecting method of the embodiment of FIG. 1.

FIG. 3 is a detailed flow chart of step S52 of the transmission hysteresis detecting method of the embodiment of FIG. 1. As shown in FIG. 3, step S52 includes step S521 and step S522.

S521: de-duplicating the motor end positions in the first mapping data and the second mapping data, and calculating output shaft end positions corresponding to the de-duplicated motor end positions based on a plurality of the output shaft end positions corresponding to the de-duplicated positons of the motor end positions by using a pre-set value obtaining rule.

In this embodiment, in order to improve the smoothness of the curve corresponding to the first mapping relationship and the second mapping relationship and reduce the operation time caused by repeated data processing, the motor end positions in the first mapping data and second mapping data or the original data not required to be mapped are de-duplicated. At the same time, according to the plurality of output shaft end positions corresponding to the de-duplicated motor end positions, the output shaft end positions corresponding to the de-duplicated motor end positions is calculated based on the preset value obtaining rule. For example, if the data of the de-duplicated motor end positions is 1905, the data of the corresponding output shaft end positions are 1911, 1911, and 1910, and the preset value obtaining rule is to take the intermediate value of the plurality of output shaft end positions, for example, 1911, then the output shaft end positions corresponding to the de-duplicated motor end positions is 1911. In other embodiments, the value obtaining rule may also be taking an average value, a maximum value, a minimum value, or the like of the plurality of output shaft end positions, and reasonable changes made by those skilled in the art on this basis are not described herein. Table 1 is an example of a de-duplication process of the original data/first mapping data.

TABLE 1 de-duplication process of original data/first mapping data

| Original Data/First Mapping Data | | De-duplicated Data | |
|---|---|---|---|
| Motor End Positions A1 | Output Shaft End Positions A2 | Motor End Positions A1' | Output Shaft End Positions A2' |
| 1906 | 1912 | 1906 | 1912 |
| 1906 | 1912 | | |
| 1906 | 1912 | | |
| 1905 | 1911 | 1905 | 1911 |
| 1905 | 1911 | | |
| 1905 | 1910 | | |
| 1904 | 1910 | 1904 | 1910 |
| 1904 | 1910 | | |
| 1903 | 1909 | 1903 | 1909 |
| 1903 | 1909 | | |
| 1903 | 1909 | | |
| 1903 | 1908 | | |
| 1902 | 1908 | 1902 | 1908 |
| 1902 | 1908 | | |
| 1902 | 1908 | | |
| 1901 | 1907 | 1901 | 1907 |
| 1901 | 1907 | | |
| 1901 | 1907 | | |
| 1901 | 1906 | | |
| 1901 | 1906 | | |
| 1901 | 1906 | | |
| 1901 | 1906 | | |
| 1901 | 1907 | | |
| 1901 | 1907 | | |
| 1901 | 1907 | | |
| 1901 | 1907 | | |

S522: generating the first mapping relationship based on the de-duplicated motor end positions and output shaft end positions corresponding to the de-duplicated motor end positions in the first mapping data, and generating the second mapping relationship based on the de-duplicated motor end positions and output shaft end positions corresponding to the de-duplicated motor end positions in the second mapping data.

After de-duplicating the motor end positions in the first mapping data and the second mapping data, the first mapping relationship is generated based on a correspondence relationship between the de-duplicated motor end positions and the output shaft end positions corresponding to the de-duplicated motor end positions in the first mapping data, and the second mapping relationship is generated based on a correspondence relationship between the de-duplicated motor end positions and the output shaft end positions corresponding to the de-duplicated motor end positions in the second mapping data.

Figure 4:
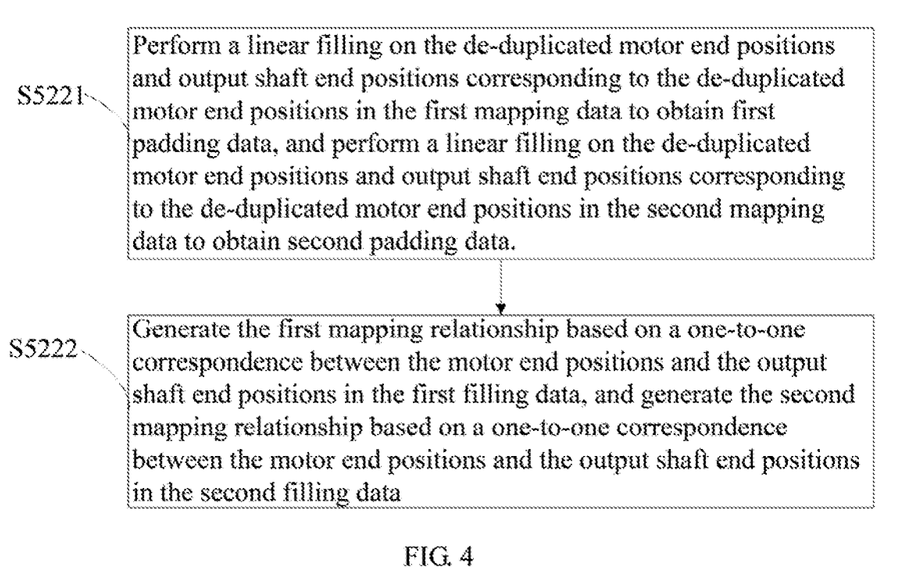
FIG. 4 is a detailed flow chart of step S522 of the transmission hysteresis detecting method of the embodiment of FIG. 1.

FIG. 4 is a detailed flow chart of step S522 of the transmission hysteresis detecting method of the embodiment of FIG. 1. As shown in FIG. 4, step S522 includes step S5221 and step S5222.

S5221: performing a linear filling on the de-duplicated motor end positions and output shaft end positions corresponding to the de-duplicated motor end positions in the first mapping data to obtain first padding data, and performing a linear filling on the de-duplicated motor end positions and output shaft end positions corresponding to the de-duplicated motor end positions in the second mapping data to obtain second padding data.

In order to further improve the smoothness of the curve corresponding to the first mapping relationship and the second mapping relationship, the linear filling is performed on the de-duplicated motor end positions and the output shaft end positions corresponding to the de-duplicated motor end positions in the first mapping data to obtain the first padding data, and the linear filling is performed on the de-duplicated motor end positions and the output shaft end positions corresponding to the de-duplicated motor end positions in the second mapping data to obtain the second padding data. In one embodiment, the de-duplicated data is linearly filled with steps of 1 in the range of the mapped data interval, and two digits of decimals in the result are remained. Table 2 is a process of a linear filling to the de-duplicated data. In other embodiments, the unit of the steps may be other values, and reasonable changes made by those skilled in the art on this basis are not described herein.

TABLE 2 a process of a linear filling to the de-duplicated data

| De-duplicated Data | | Linear Filled Data | |
|---|---|---|---|
| Motor End Positions A1' | Output Shaft End Positions A2' | Motor End Positions A1" | Output Shaft End Positions A2" |
| 3995 | 3995 | 3995 | 3995 |
| | | 3996 | 3995.50 |
| 3997 | 3996 | 3997 | 3596 |
| 3998 | 3998 | 3998 | 3998 |
| | | 3999 | 3998.50 |
| 4000 | 3999 | 4000 | 3999 |
| | | 4001 | 3999.50 |
| 4002 | 4000 | 4002 | 4000 |
| | | 4003 | 4001 |
| 4004 | 4002 | 4004 | 4002 |

S5222: generating the first mapping relationship based on a one-to-one correspondence between the motor end positions and the output shaft end positions in the first filling data, and generating the second mapping relationship based on a one-to-one correspondence between the motor end positions and the output shaft end positions in the second filling data.

The motor end position is marked as A1", the output shaft end position is marked as A2", the transmission hysteresis of the servo is E(A1"), the first mapping relationship is A2"=$f_Z$(A1"), and the second mapping relationship is A2"=$f_F$(A1"). The first mapping relationship A2"=$f_Z$(A1") is generated based on an one-to-one correspondence between the motor end positions and the output shaft end positions in the first filling data, and the second mapping relationship A"=$f_F$(A1") is generated based on an one-to-one correspondence between the motor end positions and the output shaft end positions in the second filling data. Finally, the transmission hysteresis E(A1") of the servo is calculated based on the following formula:

$$E(A1'') = \begin{cases} |f_Z(A1'') - f_F(A1'')|, & |f_Z(A1'') - f_F(A1'')| < \dfrac{A_{max}}{2} \\ A_{max} - |f_Z(A1'') - f_F(A1'')|, & \text{Otherwise} \end{cases};$$

where, $A_{max}$ is the maximum integer in the interval of the mapped motor end positions.

It should be noted that, when a load is provided on the output shaft, the transmission hysteresis of the motor will be different. The transmission hysteresis of the motor under different loads can be calculated through the above-mentioned steps.

The present disclosure realizes the smoothing of the servo control with simple mathematical formulas. The scheme has low requirements on hardware performance, which is simple to implement and can be widely applied. At the same time, the difference in the value obtaining rule and the difference in the unit of the steps in the de-duplication process and the linear filling process make the smoothing coefficient adjustable, so as to realize the smoothing effect of different levels. The present disclosure solves the problem that the conventional smoothing scheme is not effective or difficult to realize, improves the stability of the movement of the servo, and provides a simple and reliable scheme for the smoothing of the movement of digital servos.

It should be understood that, the sequence of the serial number of the steps in the above-mentioned embodiments does not mean the execution order while the execution order of each process should be determined by its function and internal logic, which should not be taken as any limitation to the implementation process of the embodiments.

Figure 5:
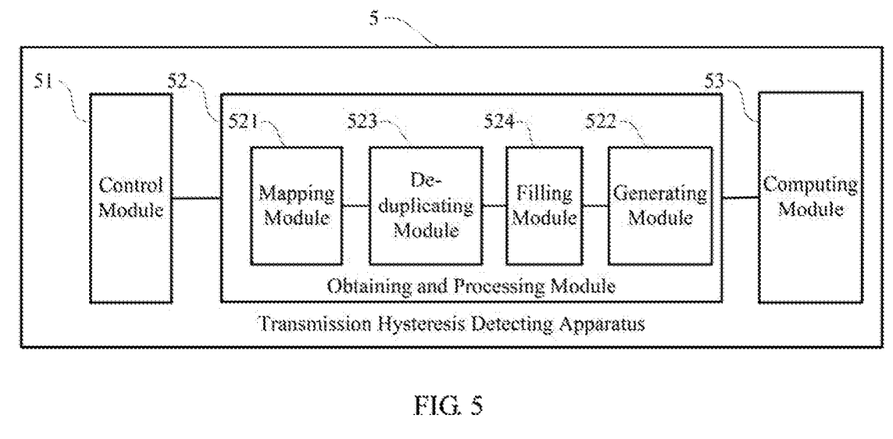
FIG. 5 is a schematic block diagram of a transmission hysteresis detecting apparatus according to a second embodiment of the present disclosure.

The embodiments of the present disclosure further provides a transmission hysteresis detecting apparatus, and each unit included in the transmission hysteresis detecting apparatus is used to execute each step in the embodiment of FIG. 1. For details, please refer to the related descriptions in the embodiment of FIG. 1. FIG. 5 is a schematic block diagram of a transmission hysteresis detecting apparatus according to a second embodiment of the present disclosure. As shown in FIG. 5, a transmission hysteresis detecting apparatus includes:

a control module 51 configured to transmit a forward rotational instruction and a reverse rotational instruction to a motor of the servo;

an obtaining and processing module 52 configured to obtain and store motor end positions of the motor and output shaft end positions of an output shaft corresponding to the motor in a forward rotational cycle and a reverse rotational cycle, respectively; generate first position data based on the motor end positions and the corresponding output shaft end positions in the forward rotational cycle; and generate second position data based on the motor end positions and the corresponding output shaft end positions in the reverse rotational cycle; and a computing module 53 configured to calculate a transmission hysteresis of the servo based on the first position data and the second position data.

Furthermore, the obtaining and processing module 52 includes a mapping module 521 and a generating module 522:

the mapping module 521 is configured to map the motor end positions and the output shaft end positions in the first position data and the second position data onto a preset data interval to form first mapping data and second mapping data; and the generating module 522 is configured to generate a first mapping relationship based on the first mapping data and generate a second mapping relationship based on the second mapping data.

The computing module 53 is further configured to calculate the transmission hysteresis of the servo based on the first mapping relationship and the second mapping relationship.

Furthermore, the obtaining and processing module 52 further includes a de-duplicating module 523 configured to de-duplicate the motor end positions in the first mapping data and the second mapping data, and calculate output shaft end positions corresponding to the de-duplicated motor end positions based on a plurality of the output shaft end positions corresponding to the positons of the de-duplicated position of the motor end by using a pre-set value obtaining rule.

The generating module 522 is further configured to generate the first mapping relationship based on the de-duplicated motor end positions and output shaft end positions corresponding to the de-duplicated motor end positions in the first mapping data, and generate the second mapping relationship based on the de-duplicated motor end positions and output shaft end positions corresponding to the de-duplicated motor end positions in the second mapping data.

Furthermore, the obtaining and processing module 52 further includes a filling module 524 configured to perform a linear filling on the de-duplicated motor end positions and output shaft end positions corresponding to the de-duplicated motor end positions in the first mapping data to obtain first padding data, and perform a linear filling on the de-duplicated motor end positions and output shaft end positions corresponding to the de-duplicated motor end positions in the second mapping data to obtain second padding data.

The generating module 522 is further configured to generate the first mapping relationship based on a one-to-one correspondence between the motor end positions and the output shaft end positions in the first filling data, and generate the second mapping relationship based on a one-to-one correspondence between the motor end positions and the output shaft end positions in the second filling data.

In which, the realized function of each module in the above-mentioned transmission hysteresis detecting apparatus corresponds to each step in the embodiment of the above-mentioned transmission hysteresis detecting method, and the functions and their implementations are not described herein. In this embodiment, each of the above-mentioned modules is implemented in the form of software, which can be computer program(s) stored in a memory of the transmission hysteresis detecting apparatus 5 and executable on a processor of the transmission hysteresis detecting apparatus 5. In other embodiments, each of the above-mentioned modules may be implemented in the form of hardware (e.g., a circuit of the transmission hysteresis detecting apparatus 5 which is coupled to the processor of the transmission hysteresis detecting apparatus 5) or a combination of hardware and software (e.g., a circuit with a single chip microcomputer).

Figure 6:
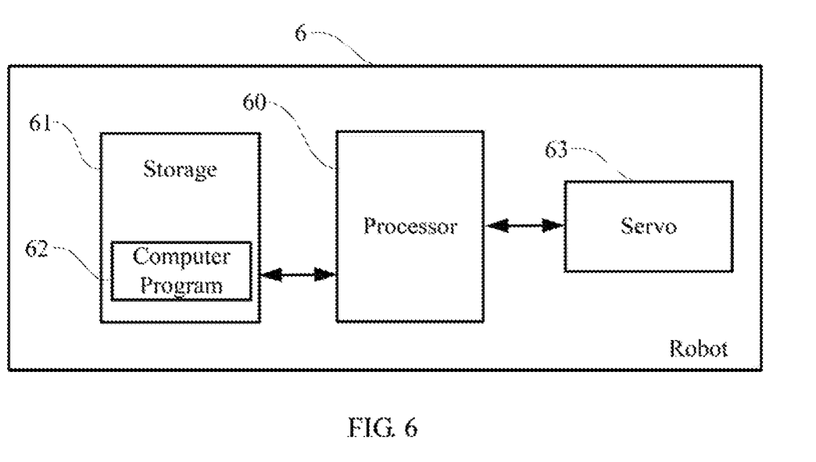
FIG. 6 is a schematic block diagram of the hardware structure of a transmission hysteresis detecting apparatus/terminal device according to a third embodiment of the present disclosure.

FIG. 6 is a schematic block diagram of the hardware structure of a transmission hysteresis detecting apparatus/terminal device according to a third embodiment of the present disclosure. As shown in FIG. 6, in this embodiment, the transmission hysteresis detecting apparatus/terminal device 6 includes a processor 60, a memory 61, a computer program 62 stored in the memory 61 and executable on the processor 60, for example, a transmission hysteresis detecting program, and a servo 63. When executing (instructions in) the computer program 62, the processor 60 implements the steps in the above-mentioned embodiments of the transmission hysteresis detecting method, for example, steps S1-S2 shown in FIG. 1. Alternatively, when the processor 60 executes the (instructions in) computer program 62, the functions of each module/unit in the above-mentioned device embodiments, for example, the functions of the modules 51-53 shown in FIG. 5 are implemented. In this embodiment, the transmission hysteresis detecting apparatus/terminal device 6 can be, for example, a robot. In other embodiments, the transmission hysteresis detecting apparatus/terminal device 6 can be an independent device applied on, for example, a robot.

Exemplarily, the computer program 62 may be divided into modules/units, and the modules/units are stored in the storage 61 and executed by the processor 60 to realize the present disclosure. The modules/units may be a series of computer program instruction sections capable of performing a specific function, and the instruction sections are for describing the execution process of the computer program 62 in the transmission hysteresis detecting apparatus/terminal device 6. For example, computer program 62 can be divided into a control module, an obtaining and processing module, and a computing module (a module in a virtual device). The functions of each module are as follows:

the control module is configured to transmit a forward rotational instruction and a reverse rotational instruction to a motor of the servo;

the obtaining and processing module is configured to obtain and store motor end positions of the motor and output shaft end positions of an output shaft corresponding to the motor in a forward rotational cycle and a reverse rotational cycle, respectively; and generate first position data and second position data; and the computing module is configured to calculate a transmission hysteresis of the servo based on the first position data and the second position data.

The transmission hysteresis detecting apparatus/terminal device 6 may include, but is not limited to, a processor 60 and a storage 61. It can be understood by those skilled in the art that FIG. 6 is merely an example of the transmission hysteresis detecting apparatus/terminal device 6 and does not constitute a limitation on the transmission hysteresis detecting apparatus/terminal device 6, and may include more or fewer components than those shown in the figure, or a combination of some components or different components. For example, the transmission hysteresis detecting apparatus/terminal device 6 may further include an input/output device, a network access device, a bus, and the like.

The processor 60 may be a central processing unit (CPU), or be other general purpose processor, a digital signal processor (DSP), an application specific integrated circuit (ASIC), a field-programmable gate array (FPGA), or be other programmable logic device, a discrete gate, a transistor logic device, and a discrete hardware component. The general purpose processor may be a microprocessor, or the processor may also be any conventional processor.

The storage 61 may be an internal storage unit of the transmission hysteresis detecting apparatus/terminal device 6, for example, a hard disk or a memory of the transmission hysteresis detecting apparatus/terminal device 6. The storage 61 may also be an external storage device of the transmission hysteresis detecting apparatus/terminal device 6, for example, a plug-in hard disk, a smart media card (SMC), a secure digital (SD) card, flash card, and the like, which is equipped on the transmission hysteresis detecting apparatus/terminal device 6. Furthermore, the storage 61 may further include both an internal storage unit and an external storage device, of the transmission hysteresis detecting apparatus/terminal device 6. The storage 61 is configured to store the computer program 62 and other programs and data required by the transmission hysteresis detecting apparatus/terminal device 6. The storage 61 may also be used to temporarily store data that has been or will be output.

Those skilled in the art may clearly understand that, for the convenience and simplicity of description, the division of the above-mentioned functional units and modules is merely an example for illustration. In actual applications, the above-mentioned functions may be allocated to be performed by different functional units according to requirements, that is, the internal structure of the device may be divided into different functional units or modules to complete all or part of the above-mentioned functions. The functional units and modules in the embodiments may be integrated in one processing unit, or each unit may exist alone physically, or two or more units may be integrated in one unit. The above-mentioned integrated unit may be implemented in the form of hardware or in the form of software functional unit. In addition, the specific name of each functional unit and module is merely for the convenience of distinguishing each other and are not intended to limit the scope of protection of the present disclosure. For the specific operation process of the units and modules in the above-mentioned system, reference may be made to the corresponding processes in the above-mentioned method embodiments, and are not described herein.

In the above-mentioned embodiments, the description of each embodiment has its focuses, and the parts which are not described or mentioned in one embodiment may refer to the related descriptions in other embodiments.

Those ordinary skilled in the art may clearly understand that, the exemplificative units and steps described in the embodiments disclosed herein may be implemented through electronic hardware or a combination of computer software and electronic hardware. Whether these functions are implemented through hardware or software depends on the specific application and design constraints of the technical schemes. Those ordinary skilled in the art may implement the described functions in different manners for each particular application, while such implementation should not be considered as beyond the scope of the present disclosure.

In the embodiments provided by the present disclosure, it should be understood that the disclosed apparatus/terminal device and method may be implemented in other manners. For example, the above-mentioned apparatus/terminal device embodiment is merely exemplary. For example, the division of modules or units is merely a logical functional division, and other division manner may be used in actual implementations, that is, multiple units or components may be combined or be integrated into another system, or some of the features may be ignored or not performed. In addition, the shown or discussed mutual coupling may be direct coupling or communication connection, and may also be indirect coupling or communication connection through some interfaces, devices or units, and may also be electrical, mechanical or other forms.

The units described as separate components may or may not be physically separated. The components represented as units may or may not be physical units, that is, may be located in one place or be distributed to multiple network units. Some or all of the units may be selected according to actual needs to achieve the objectives of this embodiment.

In addition, each functional unit in each of the embodiments of the present disclosure may be integrated into one processing unit, or each unit may exist alone physically, or two or more units may be integrated in one unit. The above-mentioned integrated unit may be implemented in the form of hardware or in the form of software functional unit.

When the integrated module/unit is implemented in the form of a software functional unit and is sold or used as an independent product, the integrated module/unit may be stored in a non-transitory computer-readable storage medium. Based on this understanding, all or part of the processes in the method for implementing the above-mentioned embodiments of the present disclosure are implemented, and may also be implemented by instructing relevant hardware through a computer program. The computer program may be stored in a non-transitory computer-readable storage medium, which may implement the steps of each of the above-mentioned method embodiments when executed by a processor. In which, the computer program includes computer program codes which may be the form of source codes, object codes, executable files, certain intermediate, and the like. The computer-readable medium may include any primitive or device capable of carrying the computer program codes, a recording medium, a USB flash drive, a portable hard disk, a magnetic disk, an optical disk, a computer memory, a read-only memory (ROM), a random access memory (RAM), electric carrier signals, telecommunication signals and software distribution media. It should be noted that the content contained in the computer readable medium may be appropriately increased or decreased according to the requirements of legislation and patent practice in the jurisdiction. For example, in some jurisdictions, according to the legislation and patent practice, a computer readable medium does not include electric carrier signals and telecommunication signals.

The above-mentioned embodiments are merely intended for describing but not for limiting the technical schemes of the present disclosure. Although the present disclosure is described in detail with reference to the above-mentioned embodiments, it should be understood by those skilled in the art that, the technical schemes in each of the above-mentioned embodiments may still be modified, or some of the technical features may be equivalently replaced, while these modifications or replacements do not make the essence of the corresponding technical schemes depart from the spirit and scope of the technical schemes of each of the embodiments of the present disclosure, and should be included within the scope of the present disclosure.

What is claimed is:

1. A computer-implemented transmission hysteresis detecting method for a servo, comprising executing on a processor the steps of:
   transmitting a forward rotational instruction and a reverse rotational instruction to a motor of the servo;
   storing one or more motor end positions of the motor and one or more output shaft end positions of an output shaft corresponding to the motor in a forward rotational cycle and a reverse rotational cycle, respectively;
   generating first position data based on the one or more motor end positions and the corresponding output shaft end positions in the forward rotational cycle;
   generating second position data based on the one or more motor end positions and the corresponding output shaft end positions in the reverse rotational cycle; and
   calculating a transmission hysteresis of the servo based on the first position data and the second position data;
   wherein both the first position data and the second position data comprise the one or more motor end positions and the one or more output shaft end positions corresponding to each position of the motor end, and the step of calculating the transmission hysteresis of the servo based on the first position data and the second position data comprises:
   mapping the one or more motor end positions and the one or more output shaft end positions in the first position data and the second position data onto a preset data interval to form first mapping data and the second mapping data; and
   generating a first mapping relationship based on the first mapping data, generating a second mapping relationship based on the second mapping data, and calculating the transmission hysteresis of the servo based on the first mapping relationship and the second mapping relationship; and
   wherein the step of generating the first mapping relationship based on the first mapping data, generating the second mapping relationship based on the second mapping data comprises:
   de-duplicating the one or more motor end positions in the first mapping data and the second mapping dat, and calculating the one or more output shaft end positioins corresponding to the one or more de-duplicated motor end positions based on a plurality of the output shaft end positions corresponding to the one or more positions of the de-duplicated position of the motor end by using a pre-set value obtaining rule; and
   generating the first mapping relationship based on the de-duplicated one or more motor end positions and the one or more output shaft end positioins corresponding to the de-duplicated one or more motor end positions in the first mapping data, and generating the second mapping relationship based on the de-duplicated one or more motor end positions and the one or more output shaft end positions corresponding to the de-duplicated one or more motor end positions in the second mapping data.

2. The method of claim 1, wherein the step of transmitting the forward rotational instruction and the reverse rotational instruction to the motor of the servo, the step of storing the one or more motor end positions of the motor and the one or more output shaft end positions of the output shaft corresponding to the motor in the forward rotational cycle and the reverse rotational cycle, respectively, the step of generating the first position data based on the one or more motor end positions and the corresponding output shaft end positions in the forward rotational cycle, and the step of generating the second position data based on the one or more motor end positions and the corresponding output shaft end positions in the reverse rotational cycle comprise:
   transmitting a forward rotational instruction to the motor of the servo, and continuously obtaining and storing the one or more motor end positions of the motor and the one or more output shaft end positions of the output shaft corresponding to the motor until the one or more motor end positions is detected as at a maximum position and generates the first position data in response to the one or more motor end positions being detected as at a minimum position; and
   transmitting a reverse rotational instruction to the motor of the servo, and continuously obtaining and storing the one or more motor end positions of the motor and the one or more output shaft end positions of the output shaft corresponding to the motor until the one or more motor end positions is detected as at the minimum position and generates the second position data in response to the one or more motor end positions being detected as at the minimum position.

3. The method of claim 1, wherein the step of generating the first mapping relationship based on the de-duplicated one or more motor end positions in the first mapping data and the one or more output shaft end positions corresponding to the de-duplicated one or more motor end positions, and generating the second mapping relationship based on the de-duplicated one or more motor end positions in the second mapping data and the one or more output shaft end positions corresponding to the de-duplicated one or more motor end positions comprises:
  performing a linear filling on the de-duplicated one or more motor end positions and the one or more output shaft end positions corresponding to the de-duplicated one or more motor end positions in the first mapping data to obtain first padding data, and performing a linear filling on the de-duplicated one or more motor end positions and the one or more output shaft end positions corresponding to the de-duplicated one or more motor end positions in the second mapping data to obtain second padding data; and
  generating the first mapping relationship based on a one-to-one correspondence between the motor end positions and the one or more output shaft end positions in the first filling data, and generating the second mapping relationship based on a one-to-one correspondence between the motor end positions and the one or more output shaft end positions in the second filling data.

4. The method of claim 3, wherein the step of calculating the transmission hysteresis of the servo based on the first mapping relationship and the second mapping relationship comprises:
  the first mapping relationship is A2"=$f_Z$(A1"), the second mapping relationship is A2"=$f_F$(A1"), and the transmission hysteresis E(A1") of the servo is calculated by the following formula:

$$E(A1'') = \begin{cases} |f_Z(A1'') - f_F(A1'')|, & |f_Z(A1'') - f_F(A1'')| < \dfrac{A_{max}}{2} \\ A_{max} - |f_Z(A1'') - f_F(A1'')|, & \text{Otherwise} \end{cases} ;$$

wherein $A_{max}$ is the maximum integer in the interval after mapping the one or more motor end positions, A1" is the motor end positions, A2" is output shaft end positions.

5. The method of claim 1, wherein the one or more motor end positions corresponding to the motor and the one or more output shaft end positions corresponding to the output shaft are obtained through a position sensor; wherein the position sensor is a potentiometer, a magnetic encoder, or a photoelectric encoder.

6. The method of claim 1, wherein a first pulse width modulation signal is applied to the motor to control the motor to rotate forwardly, and a second pulse width modulation signal is applied to the motor to control the motor to rotate reversely, and the duty ratios of the first pulse width modulation signal and the second pulse width modulation signal are both 10%-50%.

7. A transmission hysteresis detecting apparatus comprising:
  a control module configured to transmit a forward rotational instruction and a reverse rotational instruction to a motor of a servo;
  an obtaining and processing module configured to obtain and store motor end positions of the motor and output shaft end positions of an output shaft corresponding to the motor in a forward rotational cycle and a reverse rotational cycle, respectively; generate first position data based on the motor end positions and the corresponding output shaft end positions in the forward rotational cycle; and generate second position data based on the motor end positions and the corresponding output shaft end positions in the reverse rotational cycle; and
  a computing module configured to calculate a transmission hysteresis of the servo based on the first position data and the second position data;
  wherein the obtaining and processing module comprises:
  a mapping module configured to map the motor end positions and the output shaft end positions in the first position data and the second position dats onto a preset data interval to correspondingly form first mapping data and the second mapping data;
  a de-duplicating module configured to de-duplicate the motor end positions in the first mapping data and the second mapping data, and calculate output shaft end positions corresponding to the de-duplicated motor end positions based on a plurality of the output shaft end positions corresponding to the positions of the de-duplicated position of the motor end by using a pre-set value obtaining rule; and
  a generating module configured to generate a first mapping relationship based on the de-duplicated motor end positions and output shaft end positions corresponding to the de-duplicated motor end positions in the first mapping data, and generate a second mapping relationship based on the de-duplicated motor end positions and output shaft end positions corresponding to the de-duplicated motor end positioins in the second mapping data; and
  wherein the computing module is further configured to calculate the transmission hysteresis of the servo based on the first mapping relationship and the second mapping relationship.

* * * * *